(12) United States Patent
Zeng et al.

(10) Patent No.: US 9,633,839 B2
(45) Date of Patent: Apr. 25, 2017

(54) METHODS FOR DEPOSITING DIELECTRIC FILMS VIA PHYSICAL VAPOR DEPOSITION PROCESSES

(71) Applicant: APPLIED MATERIALS, INC., Santa Clara, CA (US)

(72) Inventors: Weimin Zeng, San Jose, CA (US); Thanh X. Nguyen, San Jose, CA (US); Yana Cheng, San Jose, CA (US); Yong Cao, San Jose, CA (US); Daniel Lee Diehl, Chiba (JP); Srinivas Guggilla, San Jose, CA (US); Rongjun Wang, Dublin, CA (US); Xianmin Tang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/744,688

(22) Filed: Jun. 19, 2015

(65) Prior Publication Data
US 2016/0372319 A1    Dec. 22, 2016

(51) Int. Cl.
*H01L 21/02*    (2006.01)

(52) U.S. Cl.
CPC ...... *H01L 21/0234* (2013.01); *H01L 21/0214* (2013.01); *H01L 21/02178* (2013.01); *H01L 21/02181* (2013.01); *H01L 21/02183* (2013.01); *H01L 21/02186* (2013.01); *H01L 21/02266* (2013.01)

(58) Field of Classification Search
CPC ............. H01L 21/0234; H01L 21/0214; H01L 21/02178; H01L 21/02181; H01L 21/02183; H01L 21/02186; H01L 21/02266
See application file for complete search history.

(56) References Cited

U.S. PATENT DOCUMENTS

| 6,346,488 B1 | 2/2002 | Kabansky |
| 8,323,754 B2 | 12/2012 | Olsen et al. |
| 2006/0051506 A1 | 3/2006 | Senzaki et al. |
| 2009/0258487 A1 | 10/2009 | Lin et al. |

(Continued)

OTHER PUBLICATIONS

International Search Report and Written Opinion mailed Nov. 10, 2016 for PCT Application No. PCT/US2016/037599.

*Primary Examiner* — Whitney T Moore
*Assistant Examiner* — Joseph Galvin, III
(74) *Attorney, Agent, or Firm* — Moser Taboada; Alan Taboada

(57) ABSTRACT

In some embodiments a method of processing a substrate disposed atop a substrate support in a physical vapor deposition process chamber includes: (a) depositing a dielectric layer to a first thickness atop a first surface of the substrate via a physical vapor deposition process; (b) providing a first plasma forming gas to a processing region of the physical vapor deposition process chamber, wherein the first plasma forming gas comprises hydrogen but not carbon; (c) providing a first amount of bias power to a substrate support to form a first plasma from the first plasma forming gas within the processing region of the physical vapor deposition process chamber; (d) exposing the dielectric layer to the first plasma; and (e) repeating (a)-(d) to deposit the dielectric film to a final thickness.

19 Claims, 3 Drawing Sheets

(56) References Cited

U.S. PATENT DOCUMENTS

| | | | |
|---|---|---|---|
| 2009/0286381 A1* | 11/2009 | van Schravendijk | C23C 16/045 438/435 |
| 2010/0330812 A1* | 12/2010 | Akiyama | H01L 21/02178 438/761 |
| 2011/0256673 A1* | 10/2011 | Yamazaki | C23C 14/0036 438/158 |
| 2011/0306200 A1* | 12/2011 | Lee | C23C 14/046 438/618 |
| 2013/0248352 A1 | 9/2013 | Jiang et al. | |

* cited by examiner

METHODS FOR DEPOSITING DIELECTRIC FILMS VIA PHYSICAL VAPOR DEPOSITION PROCESSES

FIELD

Embodiments of the present disclosure generally relate to methods for depositing dielectric films via a physical vapor deposition process.

BACKGROUND

Dielectric films are used in a variety of semiconductor manufacturing applications. Typically, dielectric films may be formed via a chemical vapor deposition (CVD) process or a physical vapor deposition (PVD) process. While dielectric films deposited via a CVD process can provide improved electrical properties, such as breakdown voltage (Vbd) and leakage current, as compared to dielectric films deposited via a PVD process, a PVD process provides the benefits of improved throughput via higher deposition rates and lower materials usage as compared to a CVD process.

Accordingly, the inventors have provided improved methods for depositing dielectric films via physical vapor deposition processes.

SUMMARY

Embodiments of the present disclosure include methods for depositing dielectric films via physical vapor deposition processes. In some embodiments, a method of processing a substrate disposed atop a substrate support in a physical vapor deposition process chamber includes: (a) depositing a dielectric layer to a first thickness atop a first surface of the substrate via a physical vapor deposition process; (b) providing a first plasma forming gas to a processing region of the physical vapor deposition process chamber, wherein the first plasma forming gas comprises hydrogen but not carbon; (c) providing a first amount of bias power to a substrate support to form a first plasma from the first plasma forming gas within the processing region of the physical vapor deposition process chamber; (d) exposing the dielectric layer to the first plasma; and (e) repeating (a)-(d) to deposit the dielectric layer.

In some embodiments, a method of processing a substrate disposed atop a substrate support in a physical vapor deposition process chamber, comprising: (a) depositing a dielectric layer to a first thickness of about 5 angstroms to about 60 angstroms atop a first surface of the substrate via a physical vapor deposition process; (b) providing a first plasma forming gas to a processing region of the physical vapor deposition process chamber wherein the first plasma forming gas comprises hydrogen but not carbon, and further comprises an inert gas; (c) providing a first amount of bias power to a substrate support to form a first plasma from the plasma forming gas within the processing region of the physical vapor deposition process chamber; (d) exposing the dielectric layer to the first plasma for about 10 seconds to about 30 seconds; and (e) repeating (a)-(d) to deposit the dielectric layer to a final thickness.

In some embodiments, a computer readable medium, having instructions stored thereon which, when executed, cause a physical vapor deposition process chamber to perform a method of processing a substrate disposed atop a substrate support within the physical vapor deposition process chamber are provided herein. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
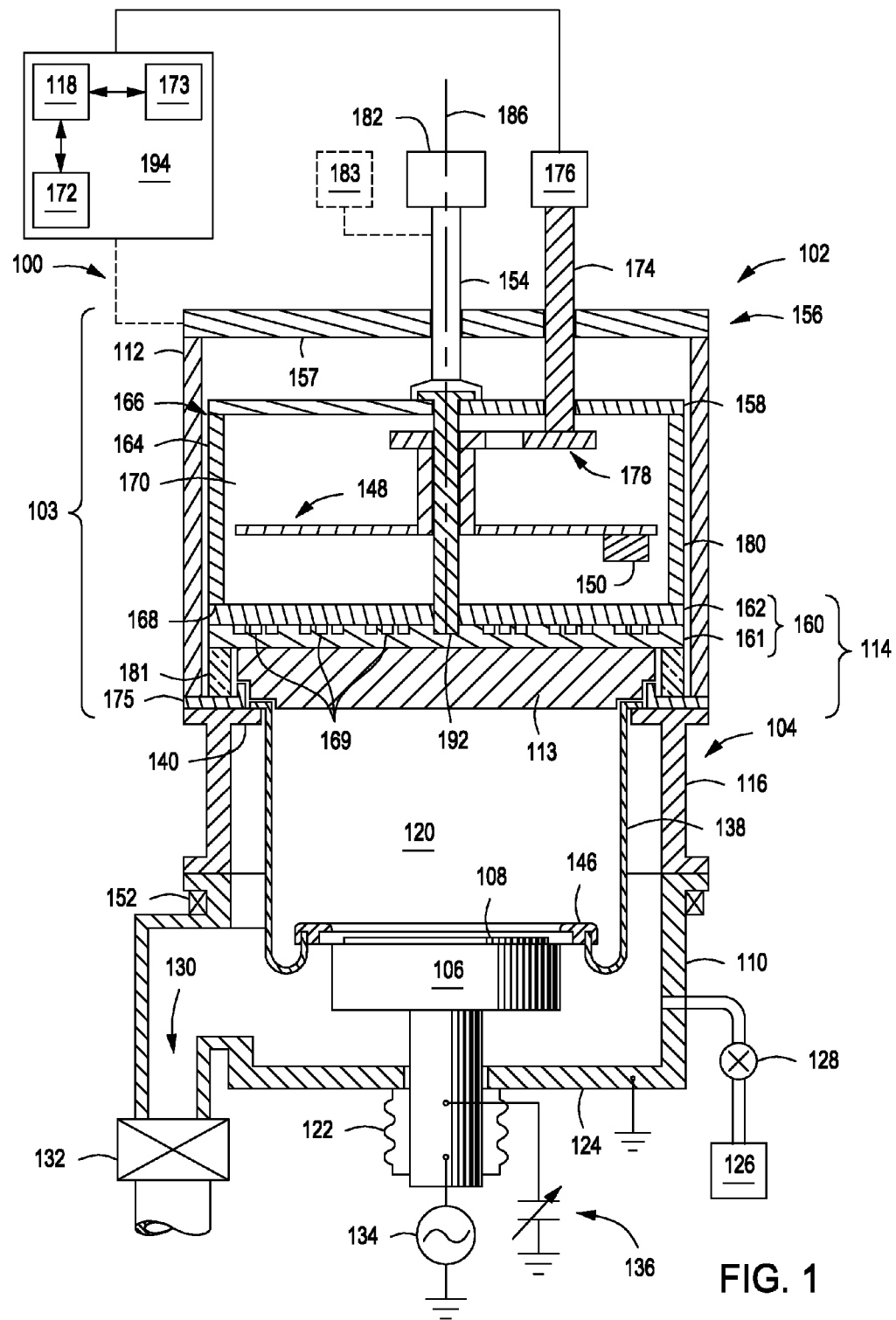
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing dielectric films via physical vapor deposition (PVD) processes. In at least some embodiments, the inventive methods described herein advantageously improve the electrical properties, such as one or more of the breakdown voltage or the leakage current, of a dielectric layer deposited via a PVD process.

Figure 2:
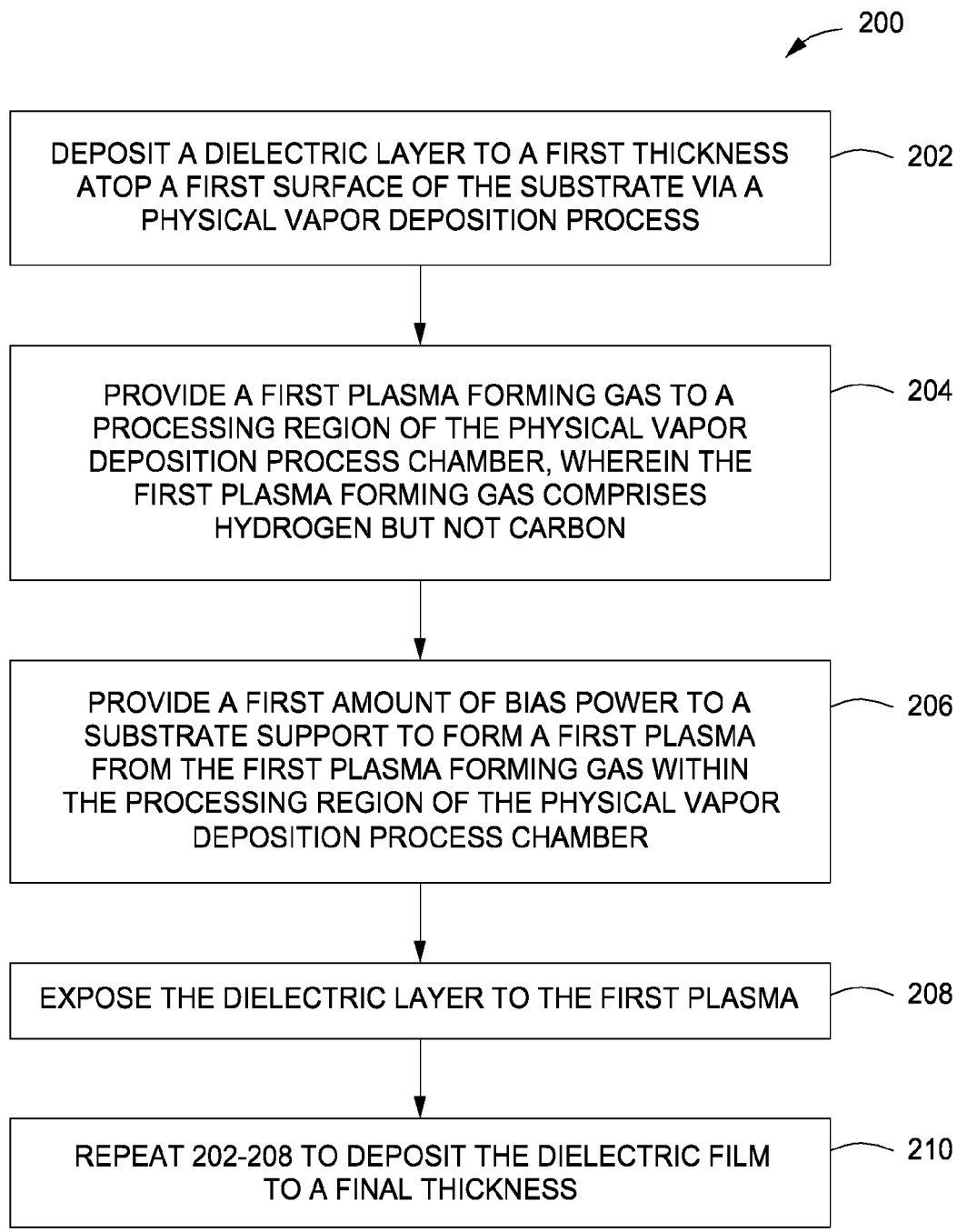
FIG. 2 depicts a flowchart of a method of processing a substrate in accordance with some embodiments of the present disclosure.

FIG. 1 depicts a simplified, cross-sectional view of an illustrative physical vapor deposition (PVD) processing system 100, in accordance with some embodiments of the present disclosure. FIG. 2 depicts a flow chart of a method 200 for depositing a dielectric layer atop a substrate disposed in a physical vapor deposition process system of the type described in FIG. 1. The method 200 is described below with respect to the stages of processing a substrate as depicted in FIGS. 3A-3E. Examples of PVD chambers suitable for performing the method 200 described herein include the CIRRUS™, AVENIR™ and IMPULSE PVD processing chambers, both commercially available from Applied Materials, Inc., of Santa Clara, Calif.

The process chamber 104 depicted in FIG. 1 comprises a substrate support 106, a target assembly 114 having an optional backing plate assembly 160 and source material 113 which is disposed on a substrate support facing side of the backing plate assembly 160. The process chamber 104 further comprises an RF power source 182 to provide RF energy to the target assembly 114. Additional details relating to the illustrative PVD processing system 100 are discussed below.

Figure 3A:
FIGS. 3A-3E depict the stages of processing a substrate in accordance with some embodiments of the present disclosure.

The method 200 begins at 202 by depositing a dielectric layer to a first thickness atop a first surface of a substrate via a physical vapor deposition process. FIG. 3A depicts a substrate 300 having a first surface 302. The substrate 300 may be any suitable substrate having any suitable geometry, such as a round wafer, square, rectangular, or the like. The substrate 300 may comprise any suitable materials, such as one or more of silicon (Si), silicon oxide ($SiO_2$), silicon nitride (SiN), glass, other dielectric materials, or the like, and may have one or more layers of other materials disposed atop the substrate 300. The substrate 300 may be a blank substrate (e.g., having no features disposed thereon), or the substrate 300 may have features formed in or on the substrate, such as vias or trenches, or high aspect ratio features, for example, for through silicon via (TSV) applications or the like.

Figure 3B:
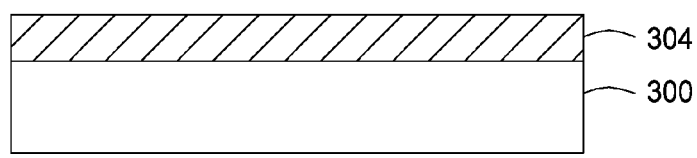

FIG. 3B depicts a dielectric layer 304 deposited atop the first surface 302 of the substrate 300. The dielectric layer is any suitable dielectric layer used in a semiconductor manufacturing process. For example, in some embodiments, the dielectric layer comprises one or more of tantalum oxide (TaO), aluminum oxynitride ($AlO_xN_y$), hafnium oxide ($HfO_x$), titanium oxynitride ($TiO_xN_y$), silicon nitride (SiN) or the like. In some embodiments, the dielectric layer 304 is deposited to a first thickness of about 5 angstroms to about 60 angstroms.

In some embodiments, the dielectric layer 304 is formed by providing a second plasma forming gas to a processing region 120 of the physical vapor deposition process chamber (e.g. process chamber 104). The plasma-forming gas may include one or more inert gases, such as a noble gas, or other inert gases. For example, non-limiting examples of suitable plasma forming gases include one or more of argon (Ar), helium (He), xenon (Xe), neon (Ne), hydrogen ($H_2$), nitrogen ($N_2$), oxygen ($O_2$). or the like. A second amount of RF power is provided to a target assembly 114 disposed opposite the substrate to form a second plasma within the processing region 120 of the process chamber 104. The RF power is an amount of RF power suitable to form a plasma within the processing region 120 and may vary depending upon chamber size, geometry, or the like. For example, in some embodiments, the first amount of RF power is about 500 to about 20000 watts. The second plasma is used to sputter a source material 113 from the target assembly 114 to deposit the dielectric layer onto the substrate. In some embodiments, the source material 113 may comprise one or more of metals, metal alloys, or the like. For example, the source material 113 may comprise one or more of titanium (Ti), tantalum (Ta), copper (Cu), cobalt (Co), tungsten (W), aluminum (Al), or the like. In some embodiments general process conditions for depositing the dielectric layer include a temperature in the physical vapor deposition process chamber during deposition of the dielectric layer of about 25 to about 400 degrees Celsius and a pressure in the physical vapor deposition process chamber during deposition of the dielectric layer is about 3 mTorr to about 40 mTorr.

Next, at 204, a first plasma forming gas is provided to a processing region of the physical vapor deposition process chamber. The first plasma forming gas comprises hydrogen but not carbon. In some embodiments, the first plasma forming gas is one or more of hydrogen ($H_2$) or ammonia ($NH_3$). The inventors have observed that hydrocarbon containing gases, such as $CH_4$, do not provide improved electrical properties of the deposited dielectric layer. The first plasma forming gas further comprises a gas suitable for striking a plasma within the physical vapor deposition process chamber, for example an inert gas, such as one or more of argon, helium, nitrogen, or the like.

Figure 3C:
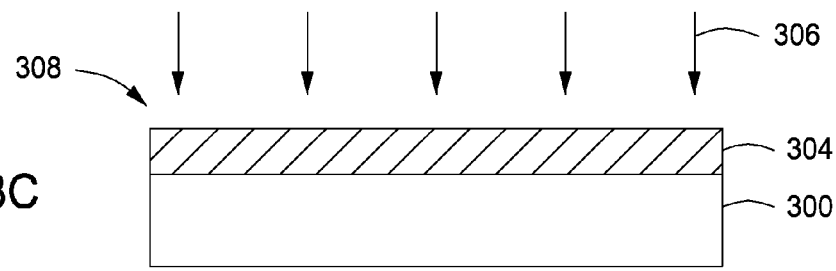

Next, at 206, a first amount of bias power is provided to a substrate support to form a first plasma 306, as depicted in FIG. 3C, within the processing region 120 of the physical vapor deposition process chamber. As depicted in FIG. 1, an RF bias power source 134 may be coupled to the substrate support 106 in order to form the plasma within the processing region 120. The RF power is an amount of RF power suitable to form a plasma within the processing region 120 and may vary depending upon chamber size, geometry, or the like. For example, RF energy (i.e. a first amount of bias power) supplied by the RF bias power source 134 may range in frequency from about 13.5 MHz to about 60 MHz. In some embodiments, RF bias power may be supplied in a range from about 50 watts to about 1500 watts, for example about 200 watts. Unlike, the second plasma described above, the first plasma 306 does not sputter source material 113 from the target assembly 114.

Next, at 208, and as depicted in FIG. 3C, the dielectric layer 304 is exposed to the first plasma 306. In some embodiments, the substrate is exposed to the hydrogen plasma for about 10 seconds to about 30 seconds. In some embodiments, general process conditions for depositing the dielectric layer include a temperature in the physical vapor deposition process chamber during exposure to the first plasma 306 of about 25 to about 400 degrees Celsius, for example about 375 degrees Celsius, and a pressure in the physical vapor deposition process chamber during exposure to first plasma 306 of at least about 5 mTorr, for example about 5 mTorr to about 40 mTorr.

Without wishing to be bound by theory, the inventors have observed that the diatomic hydrogen molecules within the first plasma disassociate into monoatomic hydrogen molecules which adhere to open bonds at the surface 308 of the dielectric layer 304 resulting in improvement of the electrical properties of the dielectric layer.

Figure 3D:
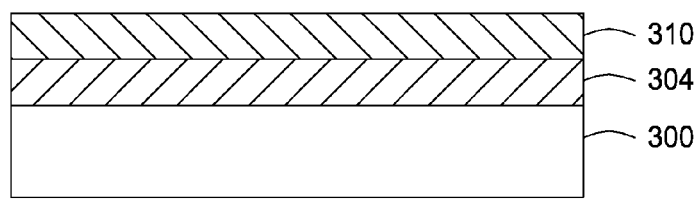
Figure 3E:
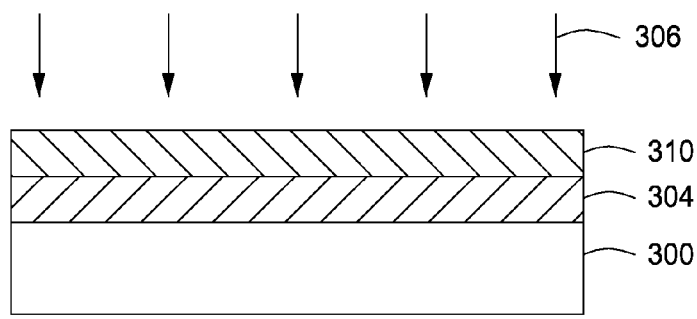

Next, at 210, 202-208 is repeated to deposit the dielectric layer to a final thickness. For example, as depicted in FIGS. 3D-3E, after a dielectric layer 304 is formed according to 202-208, a second dielectric layer 310 is deposited to a second thickness on the dielectric layer 304 and exposed to the first plasma 306 to improve the electrical properties of the second dielectric layer 310. The second dielectric layer 310 is the same material as the dielectric layer 304. In some embodiments, the second thickness is about 5 angstroms to about 60 angstroms. In some embodiments, the second thickness is equal or substantially equal to the first thickness.

The dielectric layer 304, the second dielectric layer 310, and any subsequently deposited dielectric layers deposited by further repeating the above sequence, provide a dielectric layer having a final thickness. As used herein, the term "final thickness" refers to a thickness of the dielectric layer following completion of method 200 (e.g., the sum of thicknesses of subsequently deposited dielectric layers deposited in accordance with the method 200 described herein). Although the final thickness may vary by application, in some embodiments the final thickness is about 500 to about 600 angstroms. Further variation to the thickness of the dielectric layer may occur due to subsequent processing such as by further treatment, deposition, etching, polishing, or the like.

The inventors have observed that increasing the frequency of substrate exposure to the first plasma for shorter periods of time provides greater improvement of electrical properties as compared to less frequency of exposure for longer periods of time. For example, in some embodiments, 30 exposures of the dielectric layer to the first plasma for about 10 seconds each forms a dielectric layer having a breakdown voltage of about 9.92 and a leakage current of about 1.2E-09, whereas 10 exposures at 30 seconds each forms a dielectric layer having a breakdown voltage of about 9.13 and a leakage current of about 1.6E-09. In some embodiments, the inventors have observed that exposing a dielectric layer having a first thickness of about 5 to about 10 angstroms to the first plasma for about 10 seconds each, until the dielectric layer reaches the final thickness, advantageously improves the breakdown voltage and leakage current properties of the dielectric layer.

While dielectric films deposited via a CVD process provide improved electrical properties, such as breakdown voltage (Vbd) and leakage current, as compared to a PVD process, a PVD process provides the benefits of improved throughput via higher deposition rates and lower materials usage as compared to a CVD process. The inventors have observed that depositing a dielectric layer using method 200 and the embodiments described herein improves the electrical properties of a dielectric film deposited via a PVD process while retaining the throughput and reduced materials usage benefits over CVD processes. For example, the inventors have observed that a dielectric film of silicon nitride deposited via a PVD process and subjected to a hydrogen plasma treatment as described in method 200 results in a breakdown voltage (Vbd) of 9.9 while a silicon nitride layer deposited via a PVD process and not subjected to a hydrogen plasma treatment as described in method 200 results in a breakdown voltage (Vbd) of 4.1. Similarly, the inventors have observed that a dielectric film of silicon nitride deposited via a PVD process and subjected to a hydrogen plasma treatment as described in method 200 results in leakage current of 1.2E-9 while a silicon nitride layer deposited via a PVD process and not subjected to a hydrogen plasma treatment as described in method 200 results in a leakage current of 4.3E-6.

Furthermore, the inventors have observed that a dielectric layer deposited via a PVD process and subjected to a hydrogen plasma treatment as described in method 200 provides electrical properties that are similar or better than a dielectric film deposited via a CVD process. For example, the inventors have observed that a dielectric film of silicon nitride deposited via a PVD process and subjected to a hydrogen plasma treatment as described in method 200 results in a breakdown voltage (Vbd) of 9.9 while a silicon nitride layer deposited via a CVD process provides a breakdown voltage of about 5.6 to about 7.6. Similarly, the inventors have observed that a dielectric film of silicon nitride deposited via a PVD process and subjected to a hydrogen plasma treatment as described in method 200 results in leakage current of 1.2E-9 while a silicon nitride layer deposited via a CVD process provides a leakage current of about 3E-09 to about 8E-09.

Returning to FIG. 1, a second energy source 183, optionally coupled to the target assembly 114, may provide DC power to the target assembly 114 to direct the plasma towards the target assembly 114. In some embodiments, the DC power may range from about 200 W to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the source material 113 and increased sputtering of metal atoms from the target assembly 114.

The PVD processing system 100 includes a chamber lid 102 removably disposed atop a process chamber 104. The chamber lid 102 may include the target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly. The magnetron assembly provides a rotating magnetic field proximate the target assembly 114 to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a suitable pressure inside the process chamber 104.

The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113, such as a metal, metal oxide, metal alloy, or the like, to be deposited on a substrate, such as the substrate 108 during sputtering. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source or a pulsed DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

The PVD processing system 100 further comprises a substrate support impedance circuit, such as auto capacitance tuner 136, coupled to the substrate support 106 for adjusting voltage on the substrate 108. For example, the auto capacitance tuner 136 may be used to control the voltage on the substrate 108, and thus, the substrate current (e.g., ion energy at the substrate level).

A controller 194 may be provided and coupled to various components of the PVD processing system 100 to control the operation thereof. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein, such as the method 200, may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to particular embodiments of the present disclosure, other and further embodiments of the disclosure may be devised without departing from the basic scope of the disclosure.

The invention claimed is:

1. A method of processing a substrate disposed atop a substrate support in a physical vapor deposition process chamber, comprising:
   (a) depositing a dielectric layer to a first thickness atop a first surface of the substrate via a physical vapor deposition process;
   (b) providing a first plasma forming gas to a processing region of the physical vapor deposition process chamber, wherein the first plasma forming gas comprises hydrogen but not carbon;
   (c) providing a first amount of bias power to a substrate support to form a first plasma from the first plasma forming gas within the processing region of the physical vapor deposition process chamber;
   (d) exposing the dielectric layer to the first plasma to adhere monoatomic hydrogen molecules formed in the first plasma to open bonds at a surface of the dielectric layer; and
   (e) repeating (a)-(d) to deposit the dielectric layer to a final thickness.

2. The method of claim 1, wherein the dielectric layer comprises one or more of tantalum oxide (TaO), aluminum oxynitride (AlOxNy), silicon carboxynitride (SiOxCyNz), hafnium oxide (HfOx), or titanium oxynitride (TiOxNy).

3. The method of claim 1, wherein the first plasma forming gas comprises one or more of hydrogen ($H_2$) or ammonia ($NH_3$).

4. The method of claim 1, wherein the first thickness is about 5 angstroms to about 60 angstroms.

5. The method of claim 4, wherein a thickness of each subsequently deposited dielectric layer is about 5 angstroms to about 60 angstroms.

6. The method of claim 1, wherein the dielectric layer is exposed to the first plasma for about 10 seconds to about 30 seconds.

7. The method of claim 1, wherein the first plasma forming gas further comprises one or more of argon (Ar) or nitrogen ($N_2$).

8. The method of claim 1, wherein a temperature in the physical vapor deposition process chamber is about 25 to about 400 degrees Celsius.

9. The method of claim 1, wherein a pressure in the physical vapor deposition process chamber while depositing the dielectric layer is about 3 mTorr to about 40 mTorr, and wherein the pressure in the physical vapor deposition process chamber while exposing the dielectric layer to the first plasma is about 5 mTorr to about 40 mTorr.

10. The method of claim 1, wherein the first amount of bias power is about 50 to about 1500 watts.

11. The method of claim 1, wherein depositing the dielectric layer further comprises:
    providing a second plasma forming gas to a processing region of the physical vapor deposition process chamber;
    providing a second amount of RF power to a target assembly disposed opposite the substrate to form a second plasma within the processing region of the physical vapor deposition process chamber; and
    sputtering a source material from the target assembly to deposit the dielectric layer onto the substrate.

12. A method of processing a substrate disposed atop a substrate support in a physical vapor deposition process chamber, comprising:
    (a) depositing a dielectric layer to a first thickness atop a first surface of the substrate via a physical vapor deposition process;
    (b) providing a first plasma forming gas to a processing region of the physical vapor deposition process chamber, wherein the first plasma forming gas comprises hydrogen but not carbon;
    (c) providing a first amount of bias power to a substrate support to form a first plasma from the first plasma forming gas within the processing region of the physical vapor deposition process chamber;
    (d) exposing the dielectric layer to the first plasma, wherein exposing the dielectric layer to the first plasma does not etch the dielectric layer; and
    (e) repeating (a)-(d) to deposit the dielectric layer to a final thickness.

13. A method of processing a substrate disposed atop a substrate support in a physical vapor deposition process chamber, comprising:
    (a) depositing a dielectric layer to a first thickness atop a first surface of the substrate via a physical vapor deposition process;
    (b) providing a first plasma forming gas to a processing region of the physical vapor deposition process chamber, wherein the first plasma forming gas comprises hydrogen but not carbon, and further comprises an inert gas;
    (c) providing a first amount of bias power to a substrate support to form a first plasma from the first plasma forming gas within the processing region of the physical vapor deposition process chamber;
    (d) exposing the dielectric layer to the first plasma to adhere monoatomic hydrogen molecules formed in the first plasma to open bonds at a surface of the dielectric layer; and
    (e) repeating (a)-(d) to deposit the dielectric layer to a final thickness.

14. The method of claim 13, wherein the first plasma forming gas is one or more of hydrogen ($H_2$) or ammonia ($NH_3$).

15. The method of claim 13, wherein the first thickness is about 5 angstroms to about 60 angstroms.

16. The method of claim 13, wherein the dielectric layer is exposed to the first plasma for about 10 seconds to about 30 seconds.

17. The method of claim 13, wherein the first amount of bias power is about 50 to about 1500 watts.

18. The method of claim 13, wherein depositing the dielectric layer further comprises:
- providing a second plasma forming gas to a processing region of the physical vapor deposition process chamber;
- providing a second amount of RF power to a target assembly disposed opposite the substrate to form a second plasma within the processing region of the physical vapor deposition process chamber; and
- sputtering a source material from the target assembly to deposit the dielectric layer onto the substrate.

19. The method of claim 12, wherein depositing the dielectric layer further comprises:
- providing a second plasma forming gas to a processing region of the physical vapor deposition process chamber;
- providing a second amount of RF power to a target assembly disposed opposite the substrate to form a second plasma within the processing region of the physical vapor deposition process chamber; and
- sputtering a source material from the target assembly to deposit the dielectric layer onto the substrate.

\* \* \* \* \*